(12) United States Patent
Yost

(10) Patent No.: US 10,705,173 B2
(45) Date of Patent: Jul. 7, 2020

(54) REAL-TIME AUTOMATIC CALIBRATION OF MAGNETIC SENSORS

(71) Applicant: Yost Labs Inc., Portsmouth, OH (US)

(72) Inventor: Paul Yost, Portsmouth, OH (US)

(73) Assignee: Yost Labs Inc., Portsmouth, OH (US)

( * ) Notice: Subject to any disclaimer, the term of this patent is extended or adjusted under 35 U.S.C. 154(b) by 367 days.

(21) Appl. No.: 15/692,082

(22) Filed: Aug. 31, 2017

(65) Prior Publication Data

US 2018/0059205 A1 Mar. 1, 2018

Related U.S. Application Data

(60) Provisional application No. 62/381,821, filed on Aug. 31, 2016.

(51) Int. Cl.
*G01R 35/00* (2006.01)
*G06F 17/18* (2006.01)

(52) U.S. Cl.
CPC ........... *G01R 35/005* (2013.01); *G06F 17/18* (2013.01)

(58) Field of Classification Search
CPC ............................ G01R 35/005; G06F 17/18
See application file for complete search history.

(56) References Cited

U.S. PATENT DOCUMENTS

2018/0011152 A1* 1/2018 Kaup .................... G01C 21/20

* cited by examiner

Primary Examiner — Kyle R Quigley
(74) Attorney, Agent, or Firm — Edell, Shapiro & Finnan, LLC

(57) ABSTRACT

A system, a method, and a computer program product are provided. At predetermined times, a processing element processes a new vector represented by a last received magnetic measurement from a magnetometer and indicating a direction and a magnitude of a sensed magnetic field. When the new vector satisfies multiple criteria, the new vector is added to a determined vector set. The processing element processes multiple magnetometer measurements using a Monte Carlo best fit determination and modal partitioning to produce new calibration parameters that define a calibration sphere. The new calibration parameters are applied and stored in a memory element when at least a predetermined number of vectors are consecutively added to the determined one of the multiple vector sets.

17 Claims, 3 Drawing Sheets

REAL-TIME AUTOMATIC CALIBRATION OF MAGNETIC SENSORS

This application claims the benefit of priority from Provisional Application No. 62/381,821, filed in the U.S. Patent and Trademark Office on Aug. 31, 2016. Provisional Application No. 62/381,821 is incorporated by reference, herein, in its entirety.

FIELD OF THE INVENTION

Present invention embodiments relate to a system, a method and a computer program product for real-time automatic calibration of magnetometers using a Monte-Carlo probability-based best fit determination combined with modal partitioning.

BACKGROUND

Multiple systems use a magnetometer, also known as a compass, to measure Earth's magnetic field. Such systems include 9 directions of freedom (DOF) Inertial Measurement Units (IMU), Attitude and Heading Reference Systems (AHRS), Compassing Systems, and Inertial Navigation Systems (INS). These systems generally measure a strength and a direction of the Earth's magnetic field and use the results of these measurements as critical parts of providing their core functionality.

For accurate results to be produced, each system's magnetic sensing elements must be calibrated to account for magnetic distortions that affect the sensed magnetic field. These magnetic distortions are generally considered to be one of two types: hard-iron distortions or soft-iron distortions. Hard-iron distortions are caused by objects that produce a magnetic field such as a nearby current carrying conductor or a permanent magnet in a nearby component such as a speaker or a microphone. When magnetic material is part of the system and physically attached to a same reference frame as a magnetic sensing element, then a permanent bias in output from the magnetic sensing element is created. Soft-iron distortions are caused by objects that, by being present, passively distort a reference magnetic field. The presence of these soft-iron objects causes the Earth's magnetic field to appear to be stretched, bent, or otherwise distorted. Soft-iron effects vary depending upon which direction the Earth's magnetic field is oriented relative to a magnetic sensing element body itself. Soft-iron distortion is often caused by a presence of nearby ferrous metal objects and structures made of materials such as iron, steel, or nickel. Hard-iron distortions will generally have a much larger impact upon a total error than soft-iron effects.

Methods exist for performing a calibration process, which is used to determine a nature of error effects within a system and then to compute parameters to be used in a corrective step as the magnetic sensing element operates. In this way, a magnetic sensing system can be calibrated to correct for both hard-iron and soft-iron effects. Since such systems are often not located within either fixed locations or unchanging environments, such systems are often subject to external effects that can cause changes to a magnetic domain in which the magnetic sensing element is situated. The magnetic sensing system may move through a magnetic environment in which the Earth's magnetic field appears to be distorted or an external object which causes a distortion may move into the magnetic sensing system's environment. In this manner, the magnetic sensing element, having been calibrated for an original magnetic environment, will experience erroneous sensor readings due to an altered magnetic environment.

SUMMARY

In a first aspect of various embodiments, a system for continuously calibrating a magnetic field sensing device in a changing magnetic environment is provided. The system includes a magnetometer configured to sense a magnitude and a direction of Earth's magnetic field and to provide multiple magnetic measurements along multiple magnetic sensing axes, a memory element, and a processing element coupled to the magnetometer and the memory element. Each of the magnetic measurements represents a vector indicating a direction and a magnitude of a sensed magnetic field. The magnetometer provides each respective magnetic measurement of the multiple magnetic measurements at predetermined times. At each of multiple predetermined times, the processing element is operable to perform: processing a new vector represented by a last received magnetic measurement and when the new vector fails to satisfy multiple criteria, when the new vector satisfies the multiple criteria, the processing element is operable to: add the new vector to a determined one of the multiple vector sets; process a group of multiple magnetic measurements provided over a period of time using a Monte Carlo best fit determination and modal partitioning to produce new calibration parameters which define a calibration sphere. When at least a predetermined number of vectors are consecutively added to the determined one of the multiple vector sets, the processing element is further operable to apply and store the new calibration parameters.

In a second aspect of the various embodiments, a method is provided for continuously calibrating a magnetic field sensing device in a changing magnetic environment. A processing element processes, at each of multiple predetermined times, a new vector represented by a last received magnetic measurement from a magnetometer. The new vector indicates a direction and a magnitude of a sensed magnetic field. When the new vector satisfies multiple criteria, the new vector is added to a determined one of the multiple vector sets. Multiple magnetic measurements provided over a period of time are processed using a Monte Carlo best fit determination and modal partitioning to produce new calibration parameters, which define a calibration sphere. The new calibration parameters are applied and stored in a memory element when at least a predetermined number of vectors are consecutively added to the determined one of the multiple vector sets.

In a third aspect of the various embodiments, a computer program product is provided. The computer program product includes at least one non-transitory computer readable storage medium having computer readable program code embodied therewith for execution on at least one processing element. The computer readable program code is configured to be executed by the at least one processing element to perform a number of steps at predetermined times. The number of steps include: processing of a new vector represented by a last received magnetic measurement from a magnetometer, the new vector indicating a direction and a magnitude of a sensed magnetic field. When the new vector satisfies the multiple criteria, the new vector is added to a determined one of multiple vector sets. Multiple magnetometer measurements provided over a period of time are processed using a Monte Carlo best fit determination and modal partitioning to produce new calibration parameters, which define a calibration sphere. When at least a predetermined number of vectors are consecutively added to the determined one of the multiple vector sets, the processing element applies and stores the new calibration parameters in a memory element.

DETAILED DESCRIPTION OF AN EXAMPLE EMBODIMENT

Figure 1:
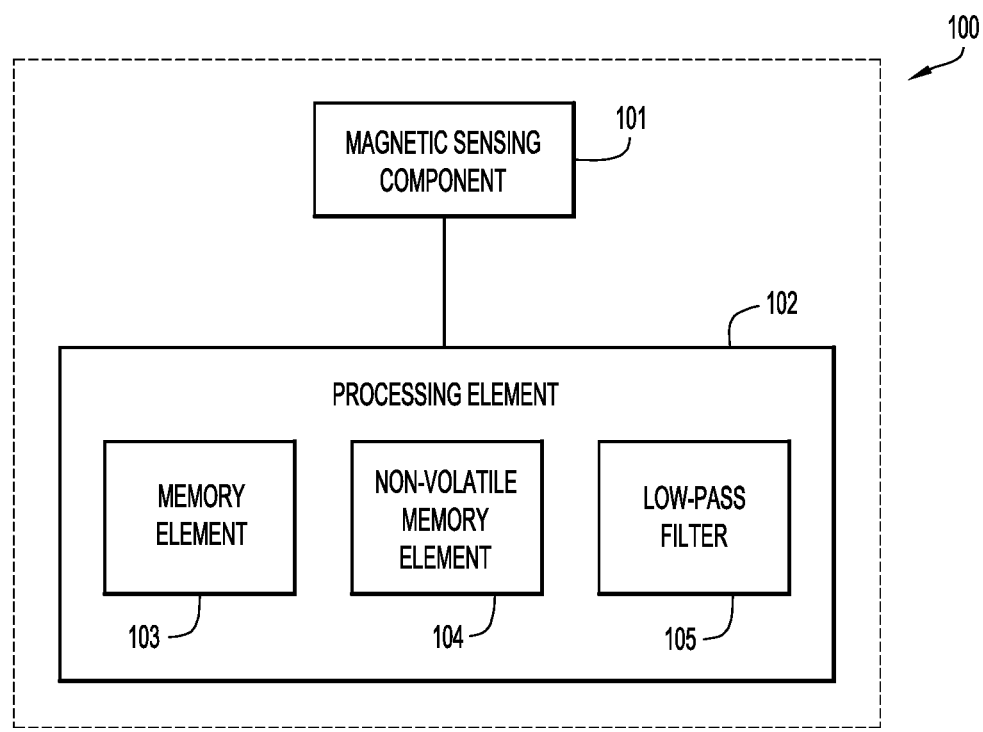
FIG. 1 is a block diagram of a system for calibrating a magnetometer according to an embodiment of the present invention.

FIG. 1 is a block diagram of an embodiment of the present invention illustrating a sensing system 100 employing magnetometer calibration. The system includes a magnetic sensing component such as a magnetometer 101 and a few other components, such as a processing element 102, a memory element 103, a non-volatile memory element 104 and a low-pass filter 105.

The magnetometer 101 of the present invention embodiment is configured to sense the magnitude and direction of Earth's magnetic field. The magnetometer may have multiple axes such that the output represents a vector that indicates the direction and magnitude of the sensed magnetic field in 3-space.

The processing element 102 of the present invention embodiment is an element (e.g., at least one processor, at least one controller, etc.) configured to process the readings from the magnetometer and apply steps to perform a Monte-Carlo method that results in magnetometer auto-calibration, while the memory element 103 is used to store a number of magnetometer readings over time along with other partial results, including, but not limited to computed variance, process state variables, and other process variables. The processing element 102 is responsible for storing and retrieving the magnetometer readings and computed values according to a method described below. Similarly, the non-volatile memory element 104 of the present invention embodiment is used to store system parameters and known good calibration parameters that may be loaded upon start-up. The low-pass filter 105 is used to slowly move a current calibration toward a new calibration.

Figure 2:
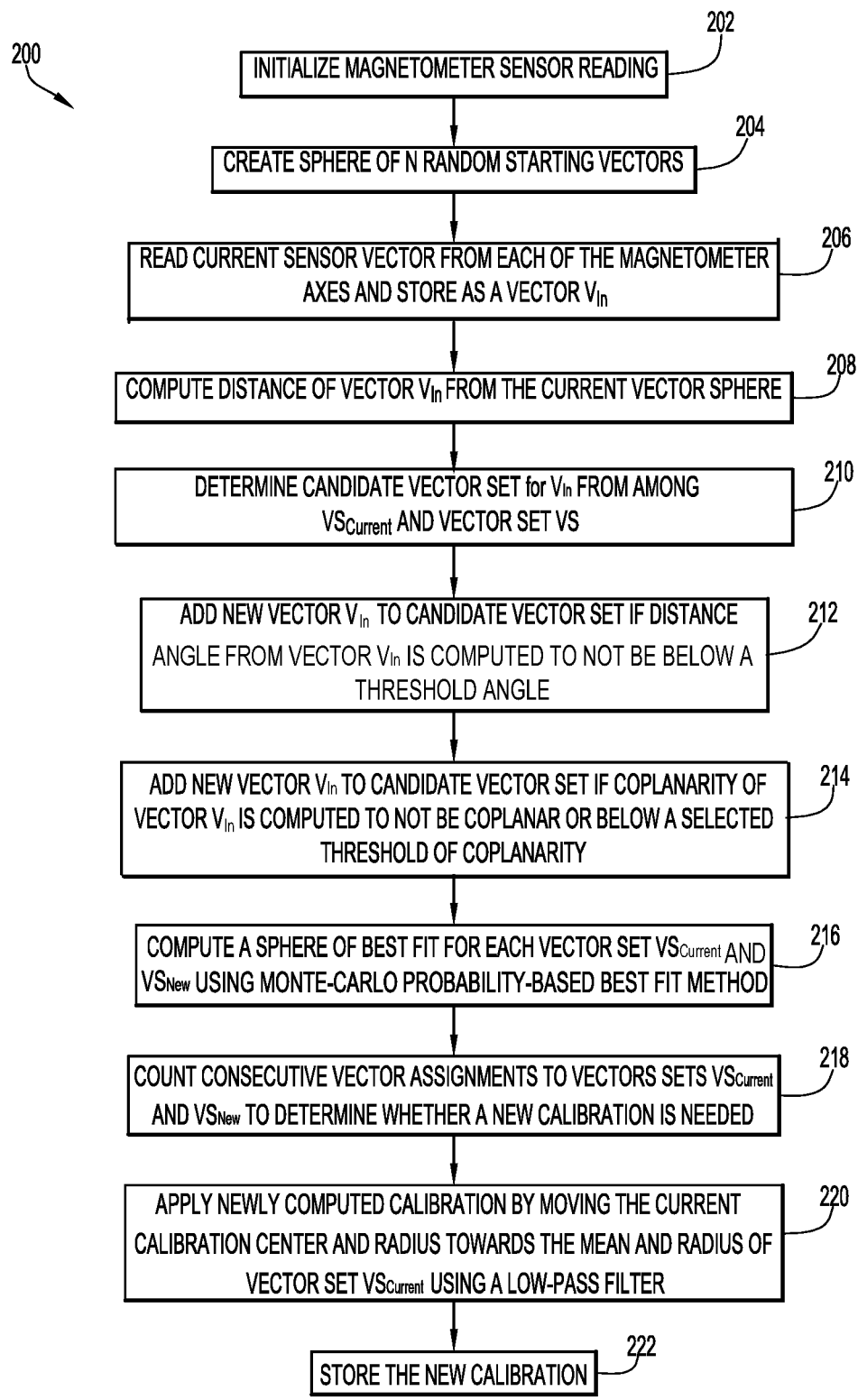
FIG. 2 is a flowchart depicting an example process for calibrating a magnetometer sensor according to an embodiment of the present invention.

Referring to FIG. 2, a process 200 for real-time automatic calibration of the magnetometer 101 begins at step 202 by initially taking magnetometer readings from each axis as follows:

Magnetometer: MX, MY, MZ
Sample Time: T

Using previously stored bias values (BV), magnetic vector magnitude (MV), and a 3×3 scale matrix (SM), a sphere of N random starting vectors is created (step 204) such that each vector has a length of MV and, when originating from BV, has an end-point that lies on the surface of the sphere ($SP_{current}$) with a center at BV and a radius of MV. Each vector then has the scale-matrix SM applied to it. This collection of N vectors is an initial configuration of a current vector set $VS_{Current}$ (representing a current calibration). A new vector set $VS_{New}$ is initially configured as an empty set (representing a new or changed calibration).

The scale matrix SM is calculated by a prior manual calibration process in which the scale matrix SM is incrementally adjusted until an error is minimized. The manual calibration process may include an adaptive least squares approach or a gradient descent approach. The scale matrix SM may be applied as a 3D transform to vectors as received from a magnetometer.

In step 206, a current vector from each of the magnetometer axes is read by processing element 102 and stored as a vector $V_{in}$ in memory element 103. In step 208, the distance of the vector $V_{in}$ from the current sphere ($SP_{current}$) is computed by the processing element 102. Specifically, the distance from the point defined by the coordinates of the vector $V_{In}$ and a surface of the current calibration sphere $SP_{Current}$ is computed. In some embodiments, the distance may be computed by determining a distance from the center of the current calibration sphere $SP_{Current}$ (e.g., the point BV) to an end point of the vector $V_{In}$, determining a difference between a radius of the current calibration sphere $SP_{Current}$ and the computed distance (e.g., |distance−radius|) and comparing the difference with a threshold $SP_{Thresh}$. This threshold may be determined via experimentation, observation, or may be dynamically selected. In some embodiments, the threshold may be 0.0001 centimeters. In other embodiments, the threshold $SP_{Thresh}$ may be another value.

In step 210, a candidate vector set for the vector $V_{In}$, stored in the memory element 103, is determined by the processing element 102. In some embodiments, if the difference between a radius of the current calibration sphere and the computed distance is greater than $SP_{Thresh}$, then the vector set $VS_{New}$ is determined to be the candidate vector set. If the difference between the radius of the current calibration sphere and the computed distance is less than or equal to $SP_{Thresh}$, then the vector set $VS_{Current}$ is determined to be the candidate vector set.

To add a new vector $V_{in}$ to the candidate vector set ($VS_{current}$ or $VS_{new}$), a distance angle from vector $V_{in}$ to each vector already within the candidate set is computed by processing element 102 (step 212). If the distance angle is below a selected threshold angle $VA_{Thresh}$ for every vector already within the candidate vector set, the new vector $V_{In}$ is rejected and not added to the candidate vector set. In step 214, the coplanarity of the vector $V_{in}$ with end points from the candidate vector set is also computed by the processing element. If the end points from the candidate vector set are coplanar or below a threshold of coplanarity, then the new vector $V_{In}$ is rejected and not added to the selected set. If, however, the new vector $V_{in}$ is neither too close to other vectors of the candidate vector set nor too coplanar to the other vectors of the candidate vector set, then it is added to the candidate vector set and a vector from within the candidate vector set is removed when a number of vectors in the candidate vector set would have exceeded a configurable maximum number of vectors. Generally, the oldest vector would be removed from the set, but other factors may be considered, or the vector to be removed may be chosen randomly.

Figure 3:
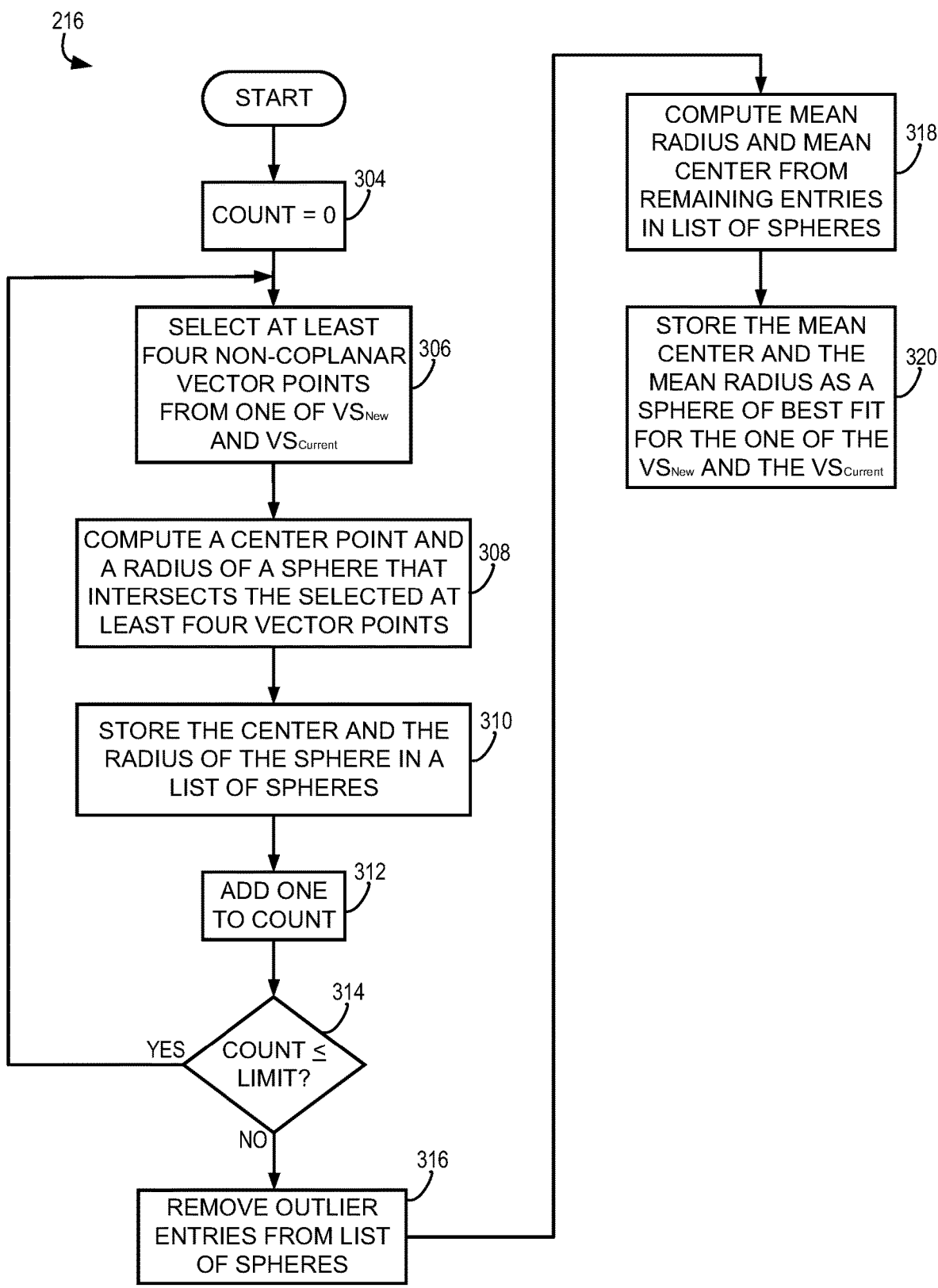
FIG. 3 is a flowchart depicting an example process for computing a sphere of best fit according to an embodiment of the present invention.

At step 216, a sphere of best-fit is computed by the processing element 102 for each vector set $VS_{Current}$ and $VS_{New}$ using a Monte-Carlo method. FIG. 3 is a flowchart of an example process that may be performed by a processing element 102, according to an embodiment, to compute a sphere of best fit for either the vector set $VS_{Current}$ or the vector set $VS_{New}$. The process may be performed once for the vector set $VS_{Current}$ and again for the vector set $VS_{New}$.

The process 216 of FIG. 3 may begin by the processing element 102 setting a count to zero (step 304). The processing element 102 may then select at least four non-coplanar vector endpoints from one of $VS_{New}$ and $VS_{Current}$ (step 306). The four vector endpoints may be selected randomly or according to some distribution. In some embodiments, the at least four vector endpoints may be considered to be non-coplanar if the at least four vector endpoints are outside of a threshold of coplanarity with respect to each other. For example, in 3-space, each of the at least four vector endpoints has three elements representing a vector endpoint in the 3-space such as, for example, a value for an x axis, a y axis and a z axis. When values of one of the x axis, the y axis and the z axis of the at least four vector endpoints has values that are within or equal to the threshold of coplanarity with respect to each other, then the at least four vector endpoints may be considered to be coplanar. Otherwise, the at least four vector endpoints may be considered to be non-coplanar.

Next, a center point and a radius of a sphere that intersects the selected at least four vector endpoints may be computed by the processing element 102 (step 308). In some embodiments, when exactly four non-coplanar vector endpoints are selected, a denominator for circle calculations may be calculated according to:

denominator=−2.0×(x1×(y2×(z3−z4)−y3×(z2−z4)+y4×(z2−z3))−x2×(y1×(z3−z4)−y3×(z1−z4)+y4×(z1−z3))+x3×(y1×(z2−z4)−y2×(z1−z4)+y4×(z1−z2))−x4×(y1×(z2−z3)−y2×(z1−z3)+y3×(z1−z2))), wherein the four vector endpoints are (x1,y1,z1), (x2,y2,z2), (x3,y3,z3) and (x4,y4,z4).

If the absolute value of the denominator is less than or equal to the threshold of coplanarity, then the four vector endpoints may be considered to be coplanar and another four vector endpoints are to be selected.

If the four vector endpoints are considered to be non-coplanar, a center of the sphere may be computed for x, y and z as follows:

$$x' = -(x1^2 + y1^2 + z1^2) \times (y2 \times (z3 - z4) - y3 \times (z2 - z4) + y4(z2 - z3)) +$$
$$(x2^2 + y2^2 + z2^2) \times (y1 \times (z3 - z4) - y3 \times (z1 - z4) + y4 \times (z1 - z3)) -$$
$$(x3^2 + y3^2 + z3^2) \times (y1 \times (z2 - z4) - y2 \times (z1 - z4) + y4 \times (z1 - z2)) +$$
$$(x4^2 + y4^2 + z4^2) \times (y1 \times (z2 - z3) - y2 \times (z1 - z3) + y3 \times (z1 - z2))$$

$$y' = (x1^2 + y1^2 + z1^2) \times (x2 \times (z3 - z4) - x3 \times (z2 - z4) + x4(z2 - z3)) -$$
$$(x2^2 + y2^2 + z2^2) \times (x1 \times (z3 - z4) - x3 \times (z1 - z4) + x4 \times (z1 - z3)) -$$
$$(x3^2 + y3^2 + z3^2) \times (x1 \times (z2 - z4) - x2 \times (z1 - z4) + x4 \times (z1 - z2)) +$$
$$(x4^2 + y4^2 + z4^2) \times (x1 \times (z2 - z3) - x2 \times (z1 - z3) + x3 \times (z1 - z2))$$

$$z' = -(x1^2 + y1^2 + z1^2) \times (x2 \times (y3 - y4) - x3 \times (y2 - y4) + x4(y2 - y3)) +$$
$$(x2^2 + y2^2 + z2^2) \times (x1 \times (y3 - y4) - x3 \times (y1 - y4) + x4 \times (y1 - y3)) -$$
$$(x3^2 + y3^2 + z3^2) \times (x1 \times (y2 - y4) - x2 \times (y1 - y4) + x4 \times (y1 - y2)) +$$
$$(x4^2 + y4^2 + z4^2) \times (x1 \times (y2 - y3) - x2 \times (y1 - y3) + x3 \times (y1 - y2))$$

$$x = \frac{x'}{\text{denominator}}, \ y = \frac{y'}{\text{denominator}} \text{ and } z = \frac{z'}{\text{denominator}}$$

The radius of the sphere may be calculated as follows:

$$r' = 2 \times ((x1^2 + y1^2 + z1^2) \times (x2 \times (y3 \times z4 - y4 \times z3) -$$
$$x3 \times (y2 \times z4 - y4 \times z2) + x4 \times (y2 \times z3 - y3 \times z2)) -$$
$$(x2^2 + y2^2 + z2^2) \times (x1 \times (y3 \times z4 - y4 \times z3) -$$
$$x3 \times (y1 \times z4 - y4 \times z1) + x4 \times (y1 \times z3 - y3 \times z1)) +$$
$$(x3^2 + y3^2 + z3^2) \times (x1 \times (y2 \times z4 - y4 \times z2) -$$
$$x2 \times (y1 \times z4 - y4 \times z1) + x4 \times (y1 \times z2 - y2 \times z1)) -$$
$$(x4^2 + y4^2 + z4^2) \times (x1 \times (y2 \times z3 - y3 \times z2) -$$
$$x2 \times (y1 \times z3 - y3 \times z1) + x3 \times (y1 \times z2 - y2 \times z1)))$$

$$r = \sqrt{\frac{r'}{\text{denominator}} + x^2 + y^2 + z^2}$$

The center of the sphere is (x, y, z) and the radius is r.

When more than 4 non-coplanar vector endpoints are selected, the center of the sphere and the radius may be calculated as follows:

$$\text{point\_list} = \begin{bmatrix} PX_0 & PY_0 & PZ_0 \\ PX_1 & PY_1 & PZ_1 \\ & \ldots & \\ PX_n & PY_n & PZ_n \end{bmatrix},$$

where $(PX_0, PY_0, PZ_0)$ through $(PX_n, PY_n, PZ_n)$ are n non-coplanar vector endpoints and n is an integer value that is greater than four.

$$\text{point\_list\_prime} = \begin{bmatrix} PX_0 & PY_0 & PZ_0 & 1.0 \\ PX_1 & PY_1 & PZ_1 & 1.0 \\ & & \ldots & \\ PX_n & PY_n & PZ_n & 1.0 \end{bmatrix}$$

$$\text{point\_list\_squares} = \begin{bmatrix} (PX_0)^2 + (PY_0)^2 + (PZ_0)^2 \\ (PX_1)^2 + (PY_1)^2 + (PZ_1)^2 \\ \ldots \\ (PX_n)^2 + (PY_n)^2 + (PZ_n)^2 \end{bmatrix},$$

which is a 1×n matrix.

b1={point_list_prime$^T$ point_list_prime}$^{-1}$
b2=point_list_prime$^T$point_list_squares
beta=b1 b2, or as a single equation:

$$\text{beta} = \begin{bmatrix} PX_0 & PY_0 & PZ_0 & 1.0 \\ PX_1 & PY_1 & PZ_1 & 1.0 \\ & & \ldots & \\ PX_n & PY_n & PZ_n & 1.0 \end{bmatrix}^T \begin{bmatrix} PX_0 & PY_0 & PZ_0 & 1.0 \\ PX_1 & PY_1 & PZ_1 & 1.0 \\ & & \ldots & \\ PX_n & PY_n & PZ_n & 1.0 \end{bmatrix}^{-1} \begin{bmatrix} PX_0 & PY_0 & PZ_0 & 1.0 \\ PX_1 & PY_1 & PZ_1 & 1.0 \\ & & \ldots & \\ PX_n & PY_n & PZ_n & 1.0 \end{bmatrix}^T$$

$$\begin{bmatrix} (PX_0)^2 + (PY_0)^2 + (PZ_0)^2 \\ (PX_1)^2 + (PY_1)^2 + (PZ_1)^2 \\ \ldots \\ (PX_n)^2 + (PY_n)^2 + (PZ_n)^2 \end{bmatrix}$$

The least-squares best fit sphere is then produced as follows:

$$\text{center} = \begin{bmatrix} 0.5 \times \text{beta}[0] \\ 0.5 \times \text{beta}[1] \\ 0.5 \times \text{beta}[2] \end{bmatrix},$$

where center is a center of the sphere $$\text{radius} = \sqrt{\text{beta}[3] + \text{center}[0]^2 + \text{center}[1]^2 + \text{center}[2]^2}$$

Returning to FIG. 3, the center and radius of the sphere may be stored in a list of spheres $L_{Spheres}$ (step 310). Count then may be incremented (step 312) and the processing element 102 may then determine whether count is less than or equal to a limit (step 314), where the limit is a number of spheres to be created. A value of the limit depends on the threshold angle $VA_{Thresh}$. In some embodiments, a value of $VA_{Thresh}$ is inversely proportional to a value of limit. In various embodiments, the limit would vary in value over a range of 10 to a number of vectors in the vector set cubed.

If the count is determined to be less than or equal to the limit in step 314, then steps 306-314 may be repeated. Otherwise, the processing element 102 may remove outlier entries from the list of spheres $L_{Spheres}$ (step 316). This may be accomplished by computing a mean and a standard deviation ($\sigma$) of the radii in the list of spheres $L_{Spheres}$ and removing all entries in the list of spheres $L_{Spheres}$ that is different from the mean by more than K $\sigma$, where K is a constant factor that defines a spread of the standard deviation ($\sigma$).

Next, the processing element 102 may compute a mean radius and a mean center from entries remaining in the list of spheres $L_{Spheres}$(step 318). The processing element 102 may then store the mean center and the mean radius as a sphere of best fit for the one of the vector set $VS_{New}$ and the vector set $VS_{Current}$ (step 320).

Returning to FIG. 2, step 218, consecutive vector assignments are counted such that if more than a selected number of vectors are consecutively added to vector set $VS_{Current}$, all entries from vector set $VS_{New}$ are cleared by processing element 102. The clearing of entries from vector set $VS_{New}$ indicates that no new calibration is needed and the $VS_{New}$ vector set is free of entries so that, when a new modal calibration is encountered, there are no old vector endpoints left from previous readings. However, if more than a selected number of consecutive vectors are added to vector set $VS_{New}$, the $VS_{New}$ vector set is identified as the new calibration sphere by the processing element 102. In this case, vector set $VS_{Current}$ is cleared, all entries are copied from the vector set $VS_{New}$ to vector set $VS_{Current}$, and the vector set $VS_{New}$ is cleared by the processing element 102.

In step 220, the once computed calibration is applied by moving the current calibration center and radius toward the mean and radius of the vector set $VS_{Current}$. This application can occur instantly. However, in some embodiments, the calibration can be applied smoothly by using the low-pass filter 105, which slowly moves the current calibration towards the newly computed calibration.

In step 222, after the new calibration is computed by processing element 102, it may be periodically or continuously stored in the non-volatile storage element 104 so that upon system restart, a calibration that is close to the last known correct calibration may be loaded into system 100. Storing the new calibration in the non-volatile memory will reduce the time needed to get good results upon power-up or system reset.

As described above, the present invention embodiment pertains to a sensing system which has been created for continuously adapting the calibration of the bias (center) and scale of a magnetometer sensor. This allows the sensor to be moved between changing magnetic environments without the need for an intrusive recalibration process. Additionally, since the embodiment of the system is continuously dynamically computing calibrations, sensor measurements are produced with minimized error due to improper calibration or due to altered magnetic environments.

In addition, the system of the present invention embodiments may include any number of any processing devices (e.g., processor, controller, etc.), and may include any combination of hardware and/or software to perform the functions described above. These devices may include any types of displays and input devices (e.g., virtual or physical keyboard, mouse, voice recognition, touch screen, etc.) to enter and/or view information.

It is to be understood that software of the present invention embodiments may be implemented in any desired computer language and could be developed by one of ordinary skill in the computer arts based on the functional descriptions contained in the specification and flow diagrams illustrated in the drawings. Further, any references herein of software performing various functions generally refer to computer systems or processors performing those functions under software control. The processor of the present invention embodiments may alternatively be implemented by any type of hardware and/or other processing circuitry.

Moreover, the various functions of the processing devices may be distributed in any manner among any number of software and/or hardware modules or units and/or circuitry, where the processing devices may be disposed locally or remotely of each other and communicate via any suitable communications medium (e.g., LAN, WAN, Intranet, Internet, hardwire, modem connection, wireless, etc.). For example, the functions of the present invention embodiment may be distributed in any manner among the processor and/or any other intermediary processing devices. The software and/or algorithms described above and illustrated in the flow diagrams may be modified in any manner that accomplishes the functions described herein. In addition, the functions in the flow diagrams or description may be performed in any order that accomplishes a desired operation.

The software of the present invention embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The processing devices of the present invention embodiments may include any conventional or other communications devices to communicate via any conventional or other protocols. The processing systems or devices may utilize any type of connection (e.g., wired, wireless, etc.).

Further, the present invention embodiments may employ any number of any type of user interface (e.g., Graphical User Interface (GUI), etc.). In some embodiments, the interface may provide a virtual reality environment, and/or be used for obtaining or providing information, where the interface may include any information arranged in any fashion. The interface may include any number of any types of objects and/or input or actuation mechanisms (e.g., buttons, icons, fields, boxes, links, etc.) disposed at any locations to enter/display information and initiate desired actions

The invention claimed is:

1. A sensing system for continuously calibrating a magnetic field sensing device in a changing magnetic environment, comprising:
a magnetometer configured to sense a magnitude and a direction of Earth's magnetic field and to provide a plurality of magnetic measurements along a plurality of magnetic sensing axes, each of the magnetic measurements represents a vector indicating a direction and a magnitude of a sensed magnetic field, wherein the magnetometer provides each respective magnetic measurement of the plurality of magnetic measurements at predetermined times;
a memory element; and
at least one processor coupled to the magnetometer and the memory element and operable to perform at each of the plurality of predetermined times:
processing a new vector represented by a last received magnetic measurement, and
determining to which one of a plurality of vector sets to add the new vector, the determining further comprises:
determining whether an endpoint of the new vector is within a distance threshold of a surface of a current calibration sphere,
determining that a new vector set of the plurality of vector sets, representing a possible new calibration, is the determined one of the plurality of vector sets when the endpoint of the new vector is not within the distance threshold, and
determining that a current vector set of the plurality of vector sets, representing a current calibration, is the determined one of the plurality of vector sets when the endpoint of the new vector is within the distance threshold;
adding the new vector to the determined one of the plurality of vector sets,
processing a group of the plurality of magnetometer measurements provided over a period of time using a Monte Carlo best fit determination to produce new calibration parameters defining a new calibration sphere, and
applying the new calibration parameters and storing the new calibration parameters in the memory element when at least a predetermined number of vectors are consecutively added to the determined one of the plurality of vector sets.

2. The sensing system of claim 1, wherein:
the at least one processor is further operable to perform:
initially creating the current vector set, representing the current calibration, and the new vector set, representing the possible new calibration, the current vector set initially including N starting vectors having a center offset based on a previously stored bias value, a previously stored magnetic vector magnitude and a previously stored scale matrix, where the N is an integer with a value of at least 4, and the new vector set initially being an empty set.

3. The sensing system of claim 1, wherein:
the at least one processor is further operable to perform at the each of the plurality of predetermined times:
determining whether the new vector satisfies a plurality of criteria, the plurality of criteria including the new vector being outside of a threshold of coplanarity with respect to vectors included in the determined one of the plurality of vector sets, and a distance angle from the new vector to each of the vectors included in the determined one of the plurality of vector sets being greater than a distance angle threshold, and
when the new vector satisfies the plurality of criteria, performing the processing of the group of the plurality of magnetometer measurements over the period of time using the Monte Carlo best fit determination, the processing of the group of the plurality of magnetometer measurements further comprises:
computing a respective sphere of best fit for the current vector set and the new vector set; and
the applying the new calibration parameters further comprises applying the new calibration parameters based on the sphere of best fit for one of the new vector set and the current vector set determined to have the at least the predetermined number of vectors consecutively added.

4. The sensing system of claim 3, wherein when the current vector set is determined to have the at least the predetermined number of vectors consecutively added, the at least one processor is operable to perform clearing of all of the vectors of the new vector set.

5. The sensing system of claim 3, wherein when the new vector set is determined to have the at least the predetermined number of vectors consecutively added, the at least one processor is operable to perform:
clearing all of the vectors of the current vector set;
copying all of the vectors of the new vector set to the current vector set; and
clearing all of the vectors of the new vector set.

6. The sensing system of claim 5, wherein the applying of the new calibration parameters is performed by using a low-pass filter.

7. A method for continuously calibrating a magnetic field sensing device in a changing magnetic environment, the method comprising:
performing at each of a plurality of predetermined times:
processing, by at least one processor, a new vector represented by a last received magnetic measurement from a magnetometer, the new vector indicating a direction and a magnitude of a sensed magnetic field,
determining, by the at least one processor, to which one of a plurality of vector sets to add the new vector, the determining further comprises:
determining, by the at least one processor, whether an endpoint of the new vector is within a distance threshold of a surface of a current calibration sphere,
determining, by the at least one processor, that a new vector set of the plurality of vector sets, representing a possible new calibration, is the determined one of the plurality of vector sets when the endpoint of the new vector is not within the distance threshold, and
determining, by the at least one processor, that a current vector set of the plurality of vector sets, representing a current calibration, is the determined one of the plurality of vector sets when the endpoint of the new vector is within the distance threshold;
adding, by the at least one processor, the new vector to the determined one of a plurality of vector sets,
processing, by the at least one processor, a plurality of magnetometer measurements provided over a period of time using a Monte Carlo best fit determination to produce new calibration parameters, the new calibration parameters defining a new calibration sphere, and performing, when at least a predetermined number of vectors are consecutively added to the determined one of the plurality of vector sets:

applying, by the at least one processor, the new calibration and storing the new calibration parameters in a memory element.

8. The method of claim 7, further comprising:
initially creating, by the at least one processor, the current vector set, representing the current calibration, and the new vector set, representing the possible new calibration, the current vector set initially including N starting vectors having a center offset based on a previously stored bias value, a previously stored magnetic vector magnitude and a previously stored scale matrix, where the N is an integer with a value of at least 4, and the new vector set initially being an empty set.

9. The method of claim 7, wherein:
determining, by the at least one processor, whether the new vector satisfies a plurality of criteria, the plurality of criteria including the new vector being outside of a threshold of coplanarity with respect to vectors included in the determined one of the plurality of vector sets, and a distance angle from the new vector to each of the vectors included in the determined one of the plurality of vector sets being greater than a distance angle threshold, and when the new vector satisfies the plurality of criteria, performing, by the at least one processor, the processing of the group of the plurality of magnetometer measurements over the period of time using the Monte Carlo best fit determination, the processing of the group of the plurality of magnetometer measurements further comprises:

computing a respective sphere of best fit for the current vector set and the new vector set; and the applying the new calibration parameters further comprises applying the new calibration parameters based on the sphere of best fit for one of the new vector set and the current vector set determined to have the at least the predetermined number of vectors consecutively added.

10. The method of claim 9, wherein when the current vector set is determined to have the at least the predetermined number of vectors consecutively added, the method further comprises clearing of all of the vectors of the new vector set.

11. The method of claim 9, wherein when the new vector set is determined to have the at least the predetermined number of vectors consecutively added, the method further comprises:

clearing all of the vectors of the current vector set;
copying all of the vectors of the new vector set to the current vector set; and
clearing all of the vectors of the new vector set.

12. The method of claim 11, wherein:
the computing of the respective sphere of best fit for the $VS_{Current}$ and the $VS_{New}$ further comprises:
repeating, a number of times, performing of:
selecting at least four of the vectors from the current vector set and at least four of the vectors from the new vector set that are not within the threshold of coplanarity, computing a center and a radius of a first sphere of best fit that intersects endpoints of the at least four selected vectors from the current vector set, computing a center and a radius of a second sphere of best fit that intersects ends of the at least four selected vectors from the new vector set, storing the center and the radius of the first sphere in a first list, and storing the center and the radius of the second sphere in a second list;

computing a first mean and a first standard deviation of the radii stored in the first list;

computing a second mean and a second standard deviation of the radii stored in the second list;

removing any entry in the first list that has a radius that is different from the first mean by more than $K_1$ multiplied by the first standard deviation, where the $K_1$ is a constant factor that defines a spread of the first standard deviation;

removing any entry in the second list that has a radius that is different from the second mean by more than $K_2$ multiplied by the second standard deviation, where the $K_2$ is a constant factor that defines a spread of the second standard deviation;

computing a new first mean of radii of remaining entries in the first list;

computing a new second mean of radii of remaining entries in the second list;

computing a new first mean center from center points of the remaining entries in the first list;

computing a new second mean center from center points of the remaining entries in the second list;

storing the new first mean of radii and the new first mean center as the sphere of best fit for the current vector set; and storing the new second mean of radii and the new second mean center as the sphere of best fit for the new vector set.

13. A computer program product comprising at least one non-transitory computer readable storage medium having computer readable program code embodied therewith for execution on at least one processor, the computer readable program code being configured to be executed by the at least one processing element to perform at each of a plurality of predetermined times:

processing a new vector represented by a last received magnetic measurement from a magnetometer, the new vector indicating a direction and a magnitude of a sensed magnetic field;

determining to which one of a plurality of vector sets to add the new vector, the determining further comprises:

determining whether an endpoint of the new vector is within a distance threshold of a surface of a current calibration sphere, determining that a new vector set of the plurality of vector sets, representing a possible new calibration, is the determined one of the plurality of vector sets when the endpoint of the new vector is not within the distance threshold, and determining that a current vector set of the plurality of vector sets, representing a current calibration, is the determined one of the plurality of vector sets when the endpoint of the new vector is within the distance threshold;

adding the new vector to the determined one of the plurality of vector sets;

processing a plurality of magnetometer measurements provided over a period of time using a Monte Carlo best fit determination to produce new calibration parameters defining a new calibration sphere, and performing, when at least a predetermined number of vectors are consecutively added to the determined one of the plurality of vector sets:

applying the new calibration parameters and storing the new calibration parameters in a memory element.

14. The computer program product of claim 13, wherein the computer readable program code is further configured to be executed by the at least one processor to perform:

initially creating the current vector set, representing the current calibration, and the new vector set, representing the possible new calibration, the current vector set initially including N starting vectors having a center offset based on a previously stored bias value, a previously stored magnetic vector magnitude and a previously stored scale matrix, where the N is an integer with a value of at least 4, and the new vector set initially being an empty set.

15. The computer program product of claim 13, wherein the computer readable program code is further configured to be executed by the at least one processor to perform at the each of the plurality of predetermined times:

determining whether the new vector satisfies a plurality of criteria, the plurality of criteria including the new vector being outside of a threshold of coplanarity with respect to vectors included in the determined one of the plurality of vector sets, and a distance angle from the new vector to each of the vectors included in the determined one of the plurality of vector sets being greater than a distance angle threshold, and when the new vector satisfies the plurality of criteria, performing the processing of the plurality of magnetometer measurements over the period of time using the Monte Carlo best fit determination, the processing of the plurality of magnetometer measurements further comprises:

computing a respective sphere of best fit for the current vector set and the new vector set; and the applying the new calibration parameters further comprises applying the new calibration parameters based on the respective sphere of best fit for one of the new vector set and the current vector set determined to have the at least the predetermined number of vectors consecutively added.

16. The method of claim 15, wherein when the current vector set is determined to have the at least the predetermined number of vectors consecutively added, the method further comprises clearing of all of the vectors of the new vector set.

17. The computer program product of claim 15, wherein when the new vector set is determined to have the at least the predetermined number of vectors consecutively added, the computer readable program code being further configured to be executed by the at least one processor to perform:

clearing all of the vectors of the current vector set;
copying all of the vectors of the new vector set to the current vector set; and
clearing all of the vectors of the new vector set.

* * * * *